US006903535B2

(12) United States Patent
Liu et al.

(10) Patent No.: US 6,903,535 B2
(45) Date of Patent: Jun. 7, 2005

(54) BIASING SYSTEM AND METHOD FOR LOW VOLTAGE DC—DC CONVERTERS WITH BUILT-IN N-FETS

(75) Inventors: Kwang H. Liu, Sunnyvale, CA (US); Sorin L. Negru, San Jose, CA (US)

(73) Assignee: Arques Technology, Inc., Santa Clara, CA (US)

( * ) Notice: Subject to any disclaimer, the term of this patent is extended or adjusted under 35 U.S.C. 154(b) by 0 days.

(21) Appl. No.: 10/414,952

(22) Filed: Apr. 16, 2003

(65) Prior Publication Data

US 2003/0193364 A1 Oct. 16, 2003

Related U.S. Application Data

(60) Provisional application No. 60/373,121, filed on Apr. 16, 2002.

(51) Int. Cl.[7] .............................................. G05F 1/652
(52) U.S. Cl. ..................... 323/222; 323/284; 323/267
(58) Field of Search ............................. 323/222, 266, 323/267, 282, 284

(56) References Cited

U.S. PATENT DOCUMENTS

| | | | | |
|---|---|---|---|---|
| 6,469,482 B1 | * | 10/2002 | Jahanshir et al. | 323/282 |
| 6,566,846 B1 | * | 5/2003 | Voo | 323/267 |
| 6,667,603 B2 | * | 12/2003 | Hiraki et al. | 323/268 |
| 6,680,603 B1 | * | 1/2004 | Klaus-Manfred | 323/266 |
| 6,734,655 B1 | * | 5/2004 | Javanifard et al. | 323/222 |
| 6,737,839 B2 | * | 5/2004 | Hiraki et al. | 323/268 |

OTHER PUBLICATIONS

Texas Instruments, "3–VT06–V Input, 6–A Output Synchronous Buck PWM Switcher With Integrated FETs (Swift™)," TPS54610, SLVS398C–Jun. 2001, Revised Jul. 2002, pp. 1–14.

Maxim Integrated Products, "Max1644, World's Smallest 2A DC–DC with Synchronous Rectifier," Maxim Quick View data sheet, <http://maxim–ic.com/quick_view2.cfm/qv_pk/2042>, Modified Jun. 2002.

Maxim Integrated Products, "Max1644, 2A, Low–Voltage, Step–down Regulator with Synchronous Rectification and Internal Switches," 19–1457, Rev. 2. Mar. 2002.

Texas Instruments, "TPS62000, TPS62001, TPS62002, TPS62003, TPS62004, TPS62005, TPS62006, TPS62007, TPS62008 High–Efficiency Step–Down Low Power DC–DC Converter" SLVS294B–Sep. 2002, Revised Jun. 2002, pp. 1–20.

Intersil, ICL7660, ICL7660A data sheet, CMOS Voltage Converters, Apr. 1999, File No. 3072.4, pp. 1–10.

* cited by examiner

Primary Examiner—Bao Q. Vu
(74) Attorney, Agent, or Firm—Dechert LLP; Anthony B. Diepenbrock, III

(57) ABSTRACT

A gate drive supply circuit generating a high-level supply voltage and a low-level supply voltage for driving N-type high-side and low-side power MOSFETs in a multiple-output, low-voltage DC-DC converter integrated circuit. The gate drive supply circuit includes a boost regulator for generating the low-level supply voltage and a charge pump doubler for generating the high-level supply voltage. Both the high-level supply voltage and the low-level supply voltage are distributed to one or more regulators, including but not limited to buck or boost type regulators.

13 Claims, 4 Drawing Sheets

BIASING SYSTEM AND METHOD FOR LOW VOLTAGE DC— DC CONVERTERS WITH BUILT-IN N-FETS

CROSS-REFERENCE TO RELATED APPLICATIONS

This application claims priority to U.S. provisional application entitled "BIASING SYSTEM AND METHOD FOR LOW VOLTAGE DC-DC CONVERTERS WITH BUILT-IN N-FETS", filed on Apr. 16, 2002, Ser. No. 60/373,121, which application is hereby incorporated by reference into the present application.

FIELD OF THE INVENTION

The present invention relates to multiple-output low-voltage DC-DC converters with integrated power MOSFETs. Specifically, the present invention is a new gate drive supply circuit for driving high-side and low-side N-type MOSFETs.

DESCRIPTION OF THE RELATED ART

Modern portable electronic devices such as digital cameras and digital video camcorders require a myriad of different power sources for their operation. For example, 2.5 volts may be required for the dynamic RAMS in these devices, 1.2 to 1.8 volts is required for an on-board microprocessor, while 5.0 volts is required for the analog circuitry and the USB interface. Other voltages are required to run various motors such as the zoom lens motor of a camera or the tape transport motor in the VCR part of the camcorder. Each of these devices however is powered by a set of batteries, usually, Lithium Ion batteries, that supply a voltage in the range of about 2.7 volts to 4.2 volt. In addition, it is common to back-up the Lithium Ion battery with 2-cell Alkaline batteries, causing the input supply to have a range of about 2.0 to 5 volts. To deliver these different voltages to the various subsystems in these portable electronic devices from a battery source having a wide input range, requires a complete power system in the portable device. Once such power system comprises a several dc-to-dc converters to convert the battery voltage to the required subsystem voltage.

Existing dc-to-dc power converters typically employ a switching regulator to create a desired voltage. One such converter is a step-down converter in which the switching transistors are a complementary pair, nMOS and pMOS, of power FETs. The P-FET transistor is used for the high side switching transistor and the N-FET transistor is used for the low side switching transistor. The use of the P-FET transistor is a disadvantage because pMOS transistors have higher on resistance ($r_{DS}$) than nMOS transistors having the same physical dimensions (W/L). The higher on-resistance occurs in an pMOS device because resistance of a MOS transistor channel is inversely proportional to the mobility of the carriers in the channel, which is lower (about ½) for pMOS transistors compared to NMOS transistors. Higher on-resistance on a switching transistor reduces the efficiency of the power conversion due to heating losses in the transistor. Also, as the battery voltage drops below 2.5 volts it becomes more difficult to fully turn on a pMOS device used in the high side of the conversion switch, because the high side P-FET requires at least 3 to 5 volts to operate properly. This restricts the range of operation for prior art down converters to 3 to 5 volts.

Some prior art buck converters with integrated N-FETs for both high-side and low-side switches use a bootstrap circuit to provide the supply power for the high-side gate driver. This bootstrap circuit allows the use of a N-FET as the high-side switch but when Vin is low, say 2V, the bootstrap voltage can go as low as 1.5V which is not sufficient to turn on the high-side FET completely.

Therefore there is a need for a power conversion device which has greater conversion efficiency and wider input voltage range.

BRIEF SUMMARY OF THE INVENTION

The present invention is directed towards the above need. An apparatus in accordance with the present invention includes a system for driving a first and second n-channel power switching transistors. The system includes a (i) power conversion circuit for generating a first regulated voltage from an input voltage and including a reference voltage generator for generating a reference voltage, and (ii) an up-converter that receives the input voltage and the reference voltage and generates the first regulated voltage; (iii) a charge pump circuit for generating a second regulated voltage from the first regulated voltage; (iv) a first voltage driver having an input for receiving a pulse stream and an output for driving the gate of the first power switching transistor, and operating from a supply voltage connected to the first regulated voltage such that the first voltage driver is capable of driving the gate of the first power switching transistor substantially close to the first regulated voltage; and (v) a second voltage driver having an input for receiving a pulse stream and an output for driving the gate of the second power switching transistor; and operating from a supply voltage connected to the second regulated voltage such that the second voltage driver is capable of driving the gate of the second power switching transistor substantially close to the second regulated voltage.

One advantage of the present invention is that it simplifies the gate drive design in a multi-output low-voltage, DC-DC converter.

Another advantage is that the present invention supports low input voltage operation.

Yet another advantage is that power conversion efficiency is improved.

Yes another advantage is that the size of integrated power MOSFETs is reduced.

BRIEF DESCRIPTION OF THE DRAWINGS

These and other features, aspects and advantages of the present invention will become better understood with regard to the following description, appended claims, and accompanying drawings where:

DETAILED DESCRIPTION OF THE INVENTION

Figure 1:
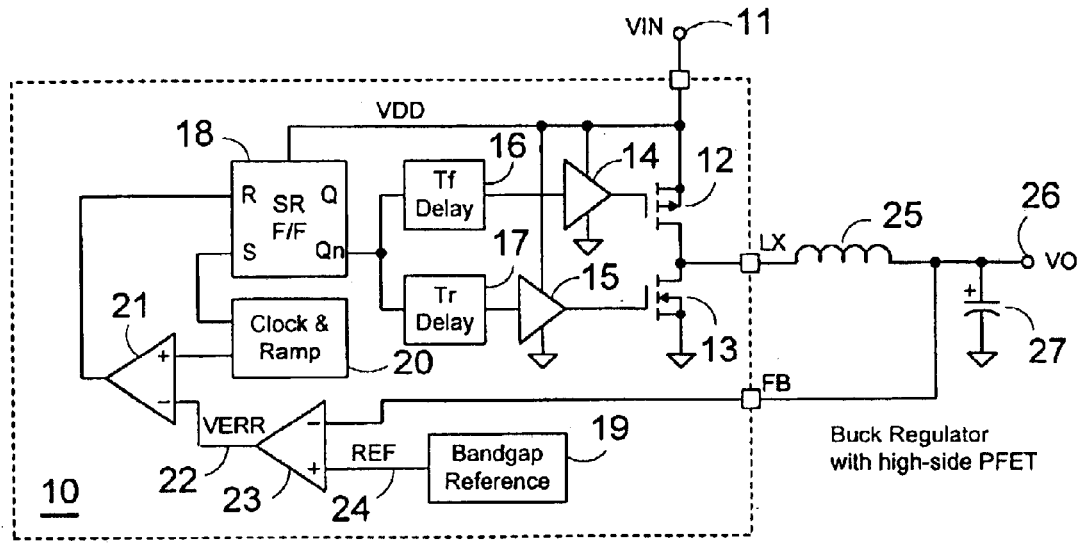
FIG. 1 shows a prior-art buck DC-DC converter using a pair of P-FET and-N-FET as high-side and low-side switches, respectively.

FIG. 1 shows a prior art buck converter using a P-FET as the high-side switch and an N-FET as the low side switch.

Input voltage VIN 11 is connected to the source terminal of the PFET 12. VIN 11 also supplies the operating VDD voltage for internal control circuit, including high-side gate driver 14, low-side gate driver 15, a Tf delay circuit 16, a Tr delay circuit 17, a set-reset (SR) flip-flop 18, a bandgap reference generator 19, a clock and ramp generator 20, a comparator 21, and an error amplifier 23.

One input of the error amplifier 21 is connected to the output of the bandgap reference generator 19, the other input of the error amplifier 21 is made available for connecting to the regulated output voltage 26. The output of the error amplifier 21 is connected to negative input of comparator 21, which has its positive input connected to the output of the clock and ramp generator 20, which also drives the set input of the SR flip-flip 18. The output of the comparator 21, is connected to the reset input of the SR flip-flop 18. The negative output (Qn) of the SR flip-flop is connected to Tf delay circuit input 16 and Tr delay circuit input 17, whose outputs connect, respectively, to the input of the high-side driver 14 and the input of the low-side driver 15. The output of the high-side driver drives the gate of the power P-FET and the output of the low-side driver drives the gate of the power N-FET. The junction between the P-FET and the N-FET, LX, is made available to connect to one node of the energy storage inductor 25, whose other node provides the output voltage VO 26. Typically, a filter capacitor 27 is also connected to the output voltage VO. 26.

In operation, to turn on P-FET 12, gate driver 14 pulls the gate of P-FET14 to ground, providing a source to gate voltage about equal to VIN, the supply voltage 11. To turn off P-FET 12, the gate driver 14 pulls the gate of P-FET 14 to approximately VIN 11, providing a gate-to-source voltage of about zero volts.

To turn on N-FET 13, low-side gate driver 115 pulls the gate of the N-FET 13 to VDD, providing a VGS of about VIN. To turn off N-FET 13, the gate driver 15 pulls the gate of the N-FET 13 to ground, providing a gate-to-source voltage of zero volts. Because the supply voltage VIN is variable, the drive to the gates of the P-FET and N-FET is variable.

Tf delay 16 and Tr delay 17 together provide anti-shoot-through protection for P-FET 12 and N-FET 13. Tf delay 16 provides a short (about 50 nsec.) falling-edge delay between gate drive 15 turning off low-side switch 13 and gate drive 14 turning on high-side switch 12. Tr delay 17 provides a short (about 50 nsec.) rising-edge delay between gate drive 14 turning off high-side switch 12 and gate drive 15 turning on low-side switch 13.

Figure 2:
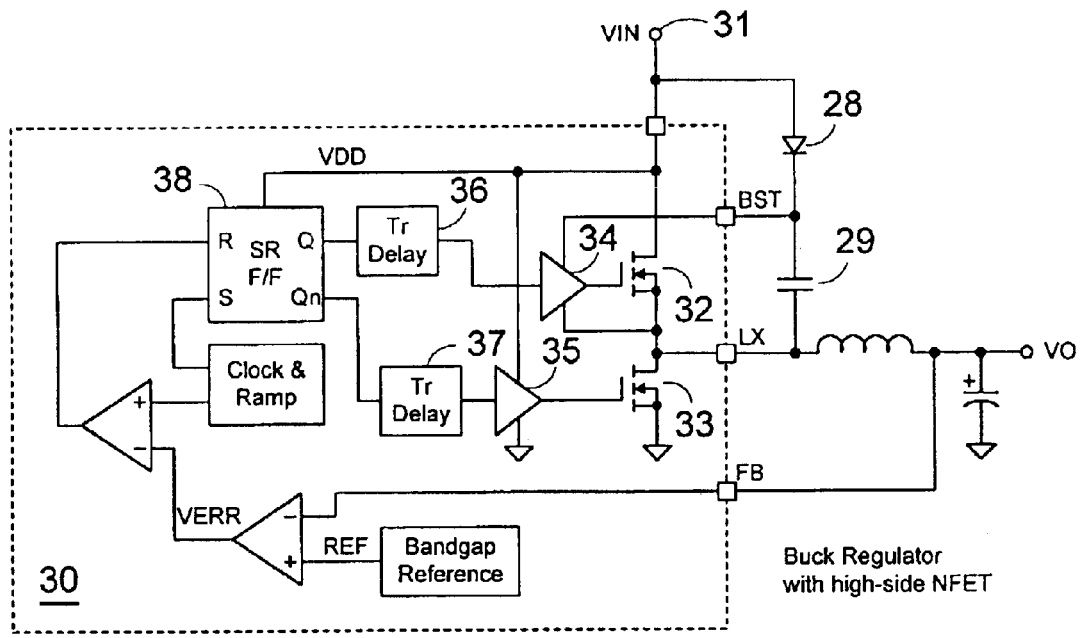
FIG. 2 shows a prior-art buck DC-DC converter using a pair of N-FETs as high-side and low-side switches wherein a boot-strap circuit is used to drive the high-side switch.

FIG. 2 shows another prior buck converter using a N-FET 32 as the high-side switch. Because N-FET 32 requires a positive gate-to-source voltage to turn on, a bootstrap circuit that includes a diode 28 and a capacitor 29 are connected in series between the supply input 31 and the output terminal LX. The junction BST between diode 28 and capacitor 29 provides the required high voltage for the N-FET 32. In addition, the gate driver 34 has its Vss terminal connected to the output node LX.

In operation, during the turn-on time of low-side switch 33, the output terminal LX is pulled to ground, allowing capacitor 29 and node BST to be charged to +VIN via the bootstrap circuit diode 28, whose positive side is connected to the VIN supply. When the high-side switch 32 is turned on by gate driver 34, the output node LX is connected via N-FET's channel to VIN. As the output node LX rises, the BST node rises, eventually becoming equal to approximately 2×VIN. This provides, via gate driver 34, high-side N-FET's gate with a gate-to-source voltage of about VIN, thereby assuring that indeed N-FET is driven on with sufficient voltage.

Tr delay circuit 36 and Tr delay circuit 37 together provide anti-shoot-through protection for high-side switch 32 and low-side switch 33. However, both Tr delay 36 and Tr delay 37 provide a short (about 50 nsec.) rising-edge delay.

Figure 3:
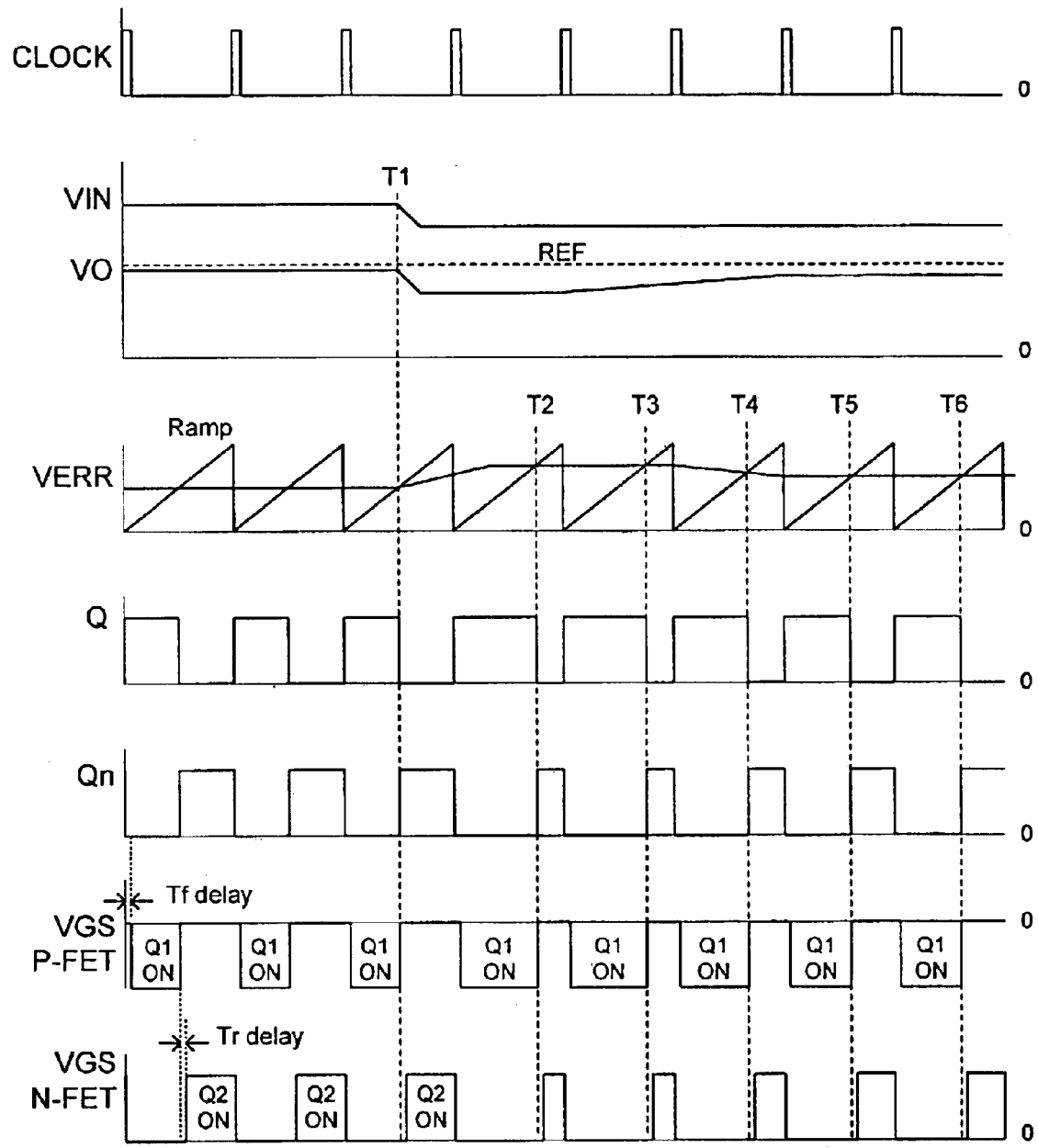
FIG. 3 shows key waveforms of a prior-art buck DC-DC converter as shown in FIG. 1.

FIG. 3 shows key waveforms of the prior art circuit of FIG. 1 during a steady-state operation. Clock and ramp circuit 20 provides a constant-frequency clock pulse train to the set input of SR flip-flop 18. The end of each pulse also begins the RAMP waveform, which terminates at the beginning of the next pulse in the pulse train. Each pulse from the clock and ramp generator also 20 sets SR flip-flop 18 to output a logic high state on its Q output. When the inverted output Qn switches to a logic low state, gate driver 15 turns off low-side N-FET 13 without delay. After a short falling-edge delay Tf (about 50 nsec.), gate driver 14 pulls the gate terminal of high-side P-FET 12 low, thus turning it on, thereby implementing a break-before-make action between the N-FET and the P-FET.

Error Amplifier 21 determines the difference, at its output VERR, between output voltage 26 and the bandgap reference generator 19. If the output voltage is less than the reference voltage REF then the output of the amplifier is some positive error voltage. When a new switching cycle starts, the clock and ramp circuit 20, starts a RAMP waveform with a constant slope. While the RAMP is less than the error voltage at VERR, the output of the comparator is at a logic low and SR flip-flop remains set, permitting the P-FET to current charge the inductor 25.

When the RAMP exceeds the error voltage at VERR, the output of comparator 21 switches to a logic high which resets SR flip-flop 18. Output Qn of the SR flip-flop now switches high causing gate driver 14 to the gate terminal of P-FET 12 to transition to a logic high, turning it off without delay. After a short rising-edge delay Tr, gate driver 15 causes the gate terminal of low-side N-FET 13 to transition to a high, thus turning it on, again implementing a break-before-make action between the N-FET and the P-FET. This causes the voltage on the node LX to transition to a logic low, while the inductor delivers its current to the load.

In a state steady operation, the duty cycle, D (for P-FET 12 being in the ON state) is generally determined by the input voltage VIN 11 and output voltage VO 26, according to the following equation D=VO/VIN. The feedback loop permits the circuit in FIG. 1 to respond to variations of input voltage and output voltage and to adjust the duty cycle D to keep output voltage VO 26 substantially close to the bandgap reference generator 19 output voltage.

For example, referring to time T1 of FIG. 3, suppose VIN 11 drops slightly from a previous level, VO 26 will drop proportionally, according to the above equation. The error amplifier 23 senses the drop in VO 26 and increases its output voltage VERR 22. A higher VERR creates a greater duty cycle D because it takes longer for RAMP to reach a higher VERR level. As shown in FIG. 3, at times T2 and T3 both, the turn-on pulse width is longer for P-FET 12. As the duty cycle D increases, VO 26 also increases and VERR 22 gradually decreases. Since the error amplifier 23 has a very high DC gain, VO 23 is eventually restored to the level of bandgap reference generator 19 output. In the new steady state, at times T5 and T6, the duty cycle is longer than the duty cycle of the previous steady state, the circuit having adjusted to the lower VIN.

Figure 4:
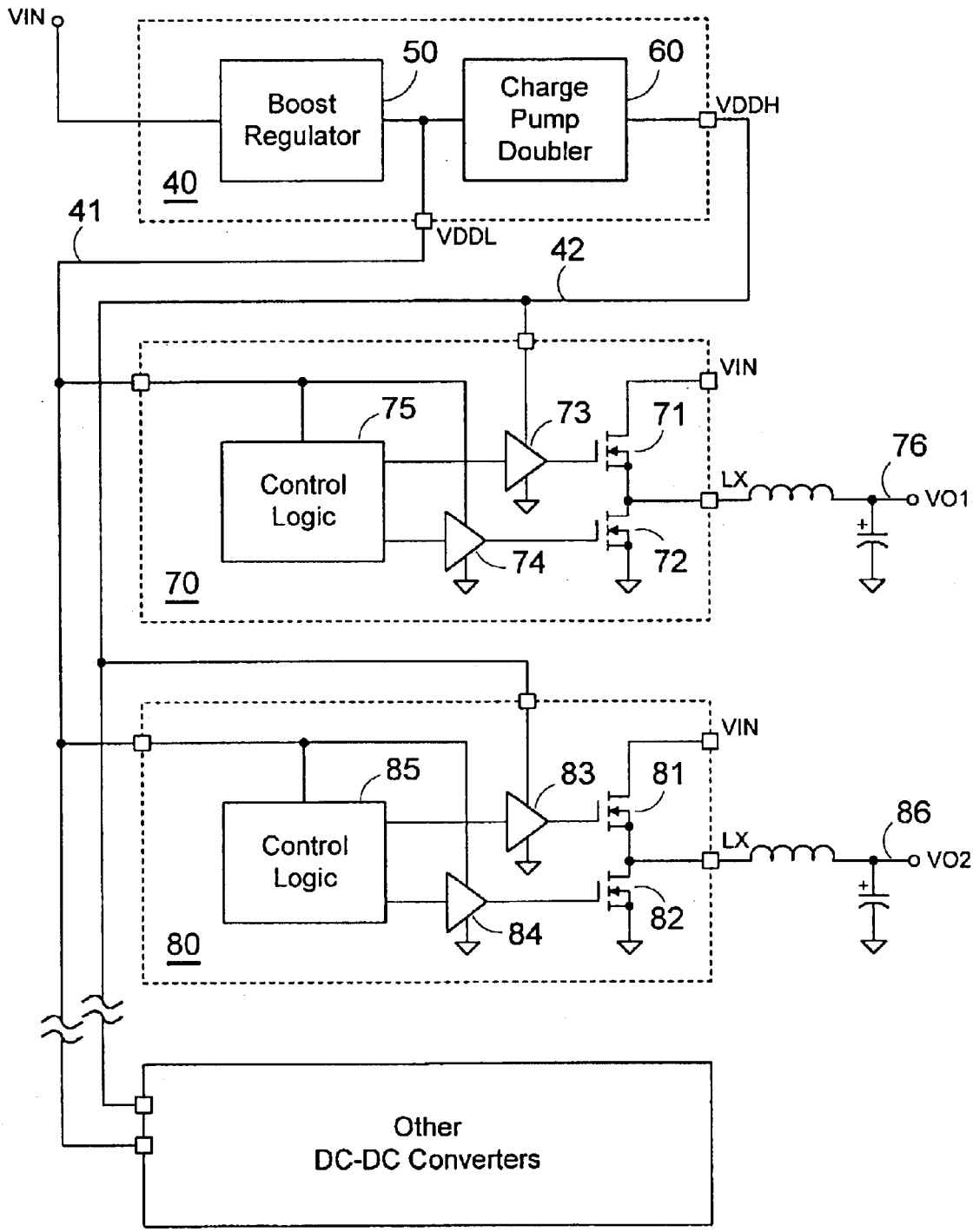
FIG. 4 shows a block schematic diagram of an embodiment of the present invention.

FIG. 4 shows a block diagram schematic of one embodiment in accordance with the present invention. A gate drive supply circuit 40 that includes a boost regulator 50 and a charge-pump (also known as switched capacitor) doubler circuit 60, generates a low-level VDDL voltage 41 (regulated at 4V to 5V), and a high-level VDDH voltage 42 (regulated at 8V to 10V).

VDDL 41 and VDDH 42 generated by gate drive supply circuit 40 is used to drive each high-side and low-side N-FET in a multiple-output DC-DC converter system.

FIG. 4 shows a first buck converter 70 with a high-side N-FET 71, a low-side N-FET 72, and control logic 75. The high-side gate drive 73 is supported by VDDH 42; whereas the low-side gate drive 74 is supported by VDDL 41. Similar to the first buck converter 70, a second buck converter 80 with a high-side N-FET 81, a low-side N-FET 82, and control logic 85 is shown. The high-side gate driver 83 is supplied by VDDH 42; whereas the low-side gate drive 84 is supplied by VDDL 41.

Figure 5:
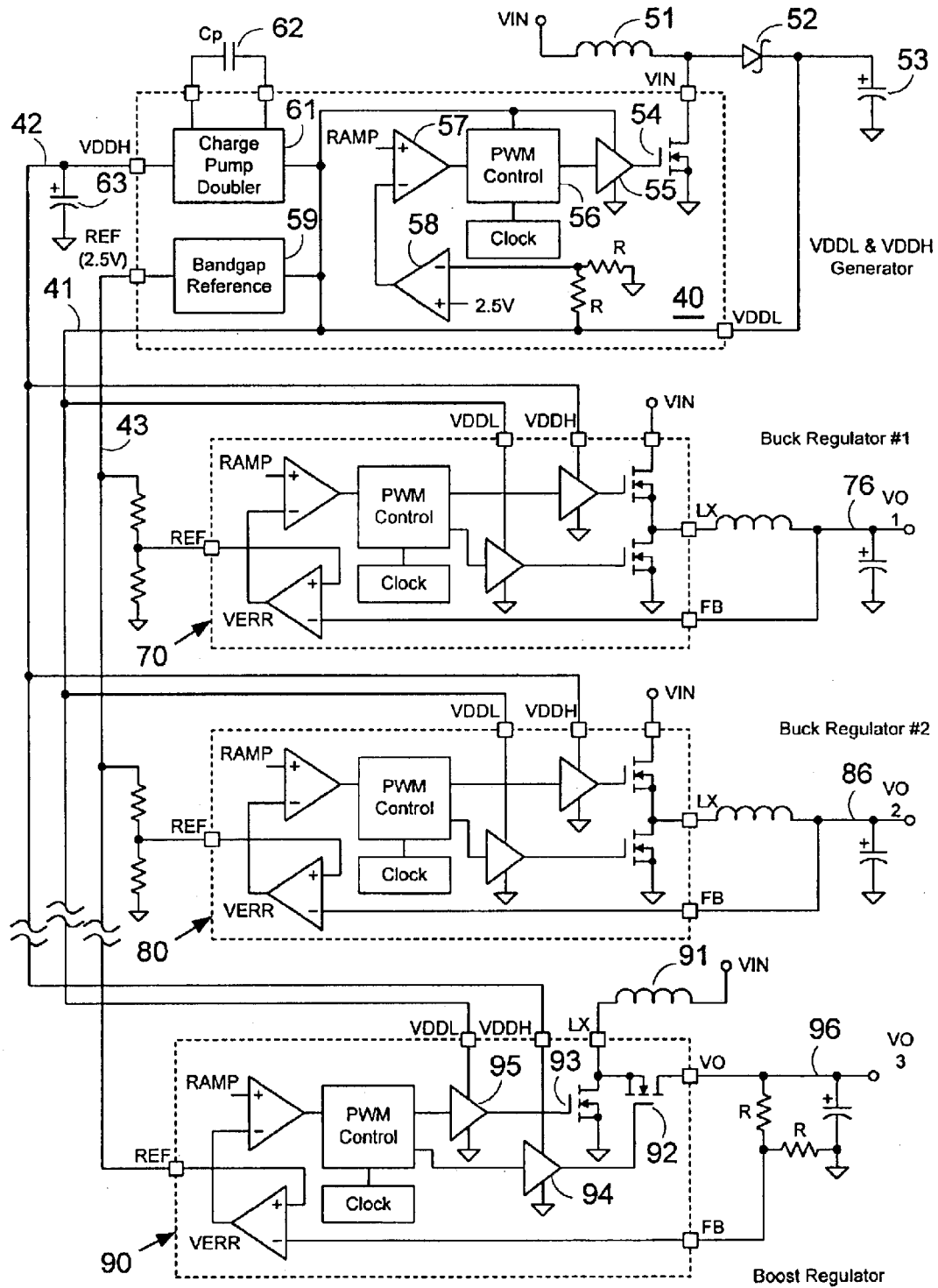
FIG. 5 shows a detailed schematic diagram of one embodiment of the present invention.

FIG. 5 shows a detailed schematic diagram of another embodiment in accordance with the present invention. Boost regulator 50 (FIG. 4) includes, in FIG. 5, an input inductor 51, a Schottky diode 52, an output capacitor 53, and an N-FET switch 54. It further includes an error amplifier 58, a comparator 57, a pulse width modulation (PWM) control circuit 56, a gate driver 55, and bandgap reference 59. The control circuit 56 is capable of starting up and generating PWM pulses to N-FET 54 from a VDDL range of 1.5V to 5V. During the start-up phase, VDDL voltage 41 maybe as low as 1.6V, which is sufficient to turn on N-FFT 54, which has a low threshold voltage Vtn. With boost regulator 50 operating, VDDL 41 gradually rises, and eventually reaches a regulated level of about 4V to 5V. Since the internal control logic is using VDDL 41 as its VDD supply, gate driver 55 provides a gate to source voltage of about 4V to 5V to N-FET 54 during steady-state operation.

Output voltage 52 is then provided to the VDDL line 41. The charge-pump doubler 61 includes an internal switch matrix, bucket capacitor 62, and output capacitor 63. By periodically charging bucket capacitor to VDDL and dumping the charge into output capacitor 63, it generates an output voltage VDDH 42 with a magnitude nearly twice the voltage of VDDL. For more detailed description of charge-pump circuit, reference to Intersil ICL7660A data sheet.

FIG. 5 also shows that VDDL 41 and VDDH 42 can be used to support other DC-DC converter topologies such as a boost regulator 90, which includes a low-side N-FET 93, and a high-side N-FET synchronous rectifier 92 and input inductor 91. A high-side gate driver 94 uses VDDH 42 to drive synchronous rectifier 92. A low-side gate driver 95 uses VDDL 41 to drive switch 93. The output voltage VO3 96 is divided by two by two resistor voltage divider and ½VO3 is fed back to the error amplifier. With a 2.5V reference supplied from circuit 40, the boost regulator 90 provides a regulated 5.0 volt output voltage 96.

Modern low-voltage power MOSFET requires a gate to source voltage of more than 4V to have a low rDS(ON) in the constant current region (CCR) to achieve higher efficiency. However, applying a gate to source voltage that is too large may damage these low-Vth power MOSFETs, because they have thin gate oxide. Such devices typically have an absolute maximum gate to source voltage rating of 7V. It is therefore important to limit the applied gate-to source voltage to between 4V and 6V.

Since the high-side N-FET 92 is driven with a gate-to-source voltage value of (VDDH–VIN), this value has to be limited to between 4V and 6V. The following table shows a desirable regulated voltage level for VDDL and VDDH when VIN is in the range of 2V to 5V.

The regulation scheme for VDDL is to regulate at [3.0V+ 0.5*Vin], but with an absolute limit at 5.0V for any input voltage.

| VIN | VDDL | VDDH (= 2 × VDDL) | VGS (high-side switch ON) |
|-----|------|-------------------|---------------------------|
| 2.0 V | 4.0 V | 8.0 V | 6.0 V |
| 2.5 V | 4.25 V | 8.5 V | 6.0 V |
| 3.0 V | 4.5 V | 9.0 V | 6.0 V |
| 3.5 V | 4.75 V | 9.5 V | 6.0 V |
| 4.0 V | 5.0 V | 10.0 V | 6.0 V |
| 4.5 V | 5.0 V | 10.0 V | 5.5 V |
| 5.0 V | 5.0 V | 10.0 V | 5.0 V |
| 5.5 V | 5.0 V | 10.0 V | 4.5 V |

Although the present invention has been described in considerable detail with reference to certain preferred versions thereof, other versions are possible. Therefore, the spirit and scope of the appended claims should not be limited to the description of the preferred versions contained herein.

What is claimed is:

1. A system for driving a first and second n-channel power switching transistors, the system comprising:
   a power conversion circuit for generating a first regulated voltage from an input voltage and including a reference voltage generator for generating a reference voltage, and an up-converter that receives the input voltage and the reference voltage and generates the first regulated voltage;
   a charge pump circuit for generating a second regulated voltage from the first regulated voltage;
   a first voltage driver having an input for receiving a pulse stream and an output for driving the gate of the first power switching transistor, and operating from a supply voltage connected to the first regulated voltage such that the first voltage driver is capable of driving the gate of the first power switching transistor substantially close to the first regulated voltage; and
   a second voltage driver having an input for receiving a pulse stream and an output for driving the gate of the second power switching transistor, and operating from a supply voltage connected to the second regulated voltage such that the second voltage driver is capable of driving the gate of the second power switching transistor substantially close to the second regulated voltage.

2. A system for driving a first and second n-channel power switching transistors, as recited in claim 1, wherein the up-converter is a boost regulator.

3. A system for driving a first and second n-channel power switching transistors, as recited in claim 1, wherein the reference voltage generator is a bandgap reference device.

4. A system for driving a first and second n-channel power switching transistors, as recited in claim 1, wherein the second regulated voltage is approximately twice the first regulated voltage.

5. A system for driving a first and second n-channel power switching transistors, as recited in claim 1, wherein the input voltage has a range of about 2 to 5½ volts and the first regulated voltage has a range of about 4 to 5 volts.

6. A system for driving a first and second n-channel power switching transistors, as recited in claim 1, wherein the input voltage has a range of about 2 to 5½ volts and the second regulated voltage has a range of about 8 to 10 volts.

7. A system for driving a first and second n-channel power switching transistors, as recited in claim 1, wherein the first regulated voltage is approximately 5 volts and the second regulated voltage is approximately 10 volts.

8. A system for driving a first and second n-channel power switching transistors, as recited in claim 1, wherein the output of the first voltage driver provides a gate voltage such that the gate-to-source voltage of the n-channel power switching transistors is in the range of approximately 4 to 6 volts.

9. A power system as recited in claim 1, wherein the up-converter includes:

- an inductor having first and second nodes, the first node for receiving a positive voltage from an external power source;
- a rectifying diode having a positive and negative node, the positive node of the rectifying diode being connected to the second node of the inductor;
- a filter capacitor having a first node connected to the negative node of the rectifying diode, and a second node being connected to a return voltage of the external power source;
- a voltage sensing circuit for sensing a voltage on the first node of the filter capacitor and providing an output giving an indication of the value of the voltage on the first node of the filter capacitor;
- an amplifier having a first input connected to the voltage sensing circuit and a second input connected to the reference voltage, an output of the amplifier providing an amplified difference between the voltage sensing circuit output and the reference voltage;
- a comparator having a positive input node connected to receive a ramp waveform and a negative input node connected to the amplifier output, the comparator operative to compare the output of the amplifier and the ramp waveform and to generate on an output node a voltage indicative of the comparison;
- a pulse generator having an input that receives the comparator output and operative to generate at an output a voltage pulse when the comparator output indicates that the output of the voltage sensing circuit is different from the reference voltage; and
- a switching transistor having a gate, source and drain, a channel being definable between the source and drain, the gate of the switching transistor being connected to the output of the pulse generator, the channel of the switching transistor being connected between the second node of the inductor and the return voltage, such that during the voltage pulse the channel of the switching transistor connects the second node of the inductor to the return voltage to store in the inductor current from the external power source, and when the voltage pulse is not present the inductor charges the filter capacitor with stored current.

10. A power system as recited in claim 8, wherein the voltage sensing circuit is a voltage divider.

11. A method for driving a first and second n-channel power switching transitors, the method comprising:

- up-converting a first regulated voltage from an input voltage source;
- generating, by means of a charge pump, a second regulated voltage from the first regulated voltage, wherein the second regulated voltage is greater than the first regulated voltage;
- driving with pulses the gate of the first power switching transistor using the first regulated voltage such that the gate of the first power switching transistor can be driven substantially close to the first regulated voltage; and
- driving with pulses the gate of the second power switching transistor using the second regulated voltage such that the gate of the second power switching transistor can be driven substantially close to the second regulated voltage.

12. A method for driving as recited in claim 11, wherein the second regulated voltage is approximately twice the first regulated voltage.

13. A method for driving as recited in claim 11, wherein the step of up-converting the first regulated voltage from an input voltage includes:

- repeatedly, during a voltage pulse with a particular duration, connecting a node of a inductor to a return voltage node to store in the inductor current drawn from the input voltage source;
- repeatedly, when the voltage pulse is not present, charging a capacitor with current stored in the inductor; and
- comparing the voltage on the capacitor with a reference voltage and adjusting the duration of the voltage pulse based on the comparison to obtain the first regulated voltage on the capacitor.

* * * * *